(12) United States Patent
Lin et al.

(10) Patent No.: US 11,686,768 B2
(45) Date of Patent: Jun. 27, 2023

(54) SYSTEM AND METHOD OF TESTING SINGLE DUT THROUGH MULTIPLE CORES IN PARALLEL

(71) Applicant: Test Research, Inc., Taipei (TW)

(72) Inventors: Ching-Chih Lin, Taipei (TW); Hsin-Wei Huang, Taipei (TW)

(73) Assignee: Test Research, Inc., Taipei City (TW)

( * ) Notice: Subject to any disclaimer, the term of this patent is extended or adjusted under 35 U.S.C. 154(b) by 72 days.

(21) Appl. No.: 17/375,013

(22) Filed: Jul. 14, 2021

(65) Prior Publication Data

US 2022/0308109 A1  Sep. 29, 2022

(30) Foreign Application Priority Data

Mar. 24, 2021 (TW) .................. 110110659

(51) Int. Cl.
*G01R 31/3177* (2006.01)
*G01R 31/28* (2006.01)
*G01R 27/26* (2006.01)
*G01R 31/317* (2006.01)
*G01R 31/319* (2006.01)
*G01R 31/50* (2020.01)

(52) U.S. Cl.
CPC ..... *G01R 31/3177* (2013.01); *G01R 27/2605* (2013.01); *G01R 31/282* (2013.01); *G01R 31/2832* (2013.01); *G01R 31/2834* (2013.01); *G01R 31/31701* (2013.01); *G01R 31/31715* (2013.01); *G01R 31/31723* (2013.01); *G01R 31/31907* (2013.01); *G01R 31/31908* (2013.01); *G01R 31/31926* (2013.01); *G01R 31/50* (2020.01)

(58) Field of Classification Search
CPC ............ G01R 31/3177; G01R 27/2605; G01R 31/50; G01R 31/2832; G01R 31/2834; G01R 31/282; G01R 31/31701; G01R 31/31723; G01R 31/31926; G01R 31/31715; G01R 31/31907; G01R 31/31908
USPC .................................. 714/733, 734, 724, 742
See application file for complete search history.

(56) References Cited

U.S. PATENT DOCUMENTS

| | | | |
|---|---|---|---|
| 6,966,018 B2 * | 11/2005 | Hilliges | G01R 31/31907 714/724 |
| 9,015,541 B2 * | 4/2015 | Shen | G01R 31/3191 324/73.1 |
| 9,810,735 B2 * | 11/2017 | Kumar | G01R 31/31715 |
| 10,156,606 B2 * | 12/2018 | Shen | G01R 31/31907 |
| 10,578,670 B2 * | 3/2020 | Kumar | G06F 11/273 |
| 11,067,623 B2 * | 7/2021 | Liu | G01R 31/50 |

(Continued)

OTHER PUBLICATIONS

Nakajima et al., An ATE Architecture for Implementing Very High Efficiency Concurrent Testing, 2012, IEEE, pp. 1-10. (Year: 2012).*

(Continued)

*Primary Examiner* — John J Tabone, Jr.
(74) *Attorney, Agent, or Firm* — CKC & Partners Co., LLC

(57) ABSTRACT

The present disclosure provides a method of testing a single device under test (DUT) through multiple cores in parallel, which includes steps as follows. The test quantity of the DUT is calculated; the test quantity of the DUT is evenly allocated to to a plurality of test cores, so as to control a period of testing the DUT through the test cores in parallel.

16 Claims, 2 Drawing Sheets

(56) References Cited

U.S. PATENT DOCUMENTS

| | | | | |
|---|---|---|---|---|
| 11,353,507 B2* | 6/2022 | Kumar | | G06F 11/273 |
| 2002/0070725 A1* | 6/2002 | Hilliges | | G01R 31/31908 |
| | | | | 714/724 |
| 2004/0255216 A1* | 12/2004 | Ichiyoshi | | G01R 31/318307 |
| | | | | 714/742 |
| 2006/0282735 A1* | 12/2006 | Weinraub | | G01R 31/31926 |
| | | | | 714/742 |
| 2010/0131224 A1* | 5/2010 | Maeda | | G01R 31/3172 |
| | | | | 702/123 |
| 2012/0191402 A1* | 7/2012 | Filler | | G11C 29/56 |
| | | | | 702/119 |
| 2013/0231886 A1* | 9/2013 | Yaguchi | | G06F 11/273 |
| | | | | 702/119 |
| 2013/0231888 A1* | 9/2013 | Sugimura | | G06F 11/26 |
| | | | | 702/123 |
| 2013/0268819 A1* | 10/2013 | Chae | | G01R 31/31715 |
| | | | | 714/733 |
| 2014/0278177 A1* | 9/2014 | Nguyen | | G01R 31/31907 |
| | | | | 702/81 |
| 2017/0089981 A1* | 3/2017 | Kumar | | G01R 31/3177 |
| 2018/0024193 A1* | 1/2018 | Kumar | | G01R 31/3177 |
| | | | | 714/27 |
| 2018/0128873 A1* | 5/2018 | Petrov | | G01R 31/2834 |
| 2020/0363465 A1* | 11/2020 | Liu | | G01R 31/2834 |
| 2020/0393509 A1* | 12/2020 | Kim | | G01R 31/319 |
| 2021/0041488 A1* | 2/2021 | Bismuth | | G01R 27/2605 |
| 2022/0034962 A1* | 2/2022 | Kazarians | | G01R 22/10 |
| 2022/0035392 A1* | 2/2022 | Kazarians | | G05F 1/575 |
| 2022/0137130 A1* | 5/2022 | Kim | | G01R 31/3181 |
| | | | | 714/724 |
| 2022/0308109 A1* | 9/2022 | Lin | | G01R 31/3177 |

OTHER PUBLICATIONS

Kim et al. A Novel Massively Parallel Testing Method Using Multi-Root for High Reliability, Mar. 2015, IEEE, vol. 64, No. 1, pp. 486-496. (Year: 2015).*

Adachi et al., Parallel, Multi-DUT Testing in an Open Architecture Test System, 2005, IEEE, Paper 35.1, pp. 1-9. (Year: 2005).*

* cited by examiner

SYSTEM AND METHOD OF TESTING SINGLE DUT THROUGH MULTIPLE CORES IN PARALLEL

This application claims priority to Taiwan Application Serial Number 110110659, filed Mar. 24, 2021, which is herein incorporated by reference.

BACKGROUND

Field of Invention

The present invention relates to test systems and methods, and more particularly, a system and a method of testing a single device under test (DUT) through multiple cores in parallel.

Description of Related Art

A device under test (DUT), also known as equipment under test (EUT) and unit under test (UUT), is a manufactured product undergoing testing, either at first manufacture or later during its life cycle as part of ongoing functional testing and calibration checks. This can include a test after repair to establish that the product is performing in accordance with the original product specification. In the electronics industry a DUT is any electronic assembly under test. However, the current testing period of time of the test equipment is still not short enough.

In view of the foregoing, there still exist some problems on the testing period of time that await further improvement. However, those skilled in the art sought vainly for a solution. Accordingly, there is an urgent need in the related field to test the DUT more efficiently.

SUMMARY

The following presents a simplified summary of the disclosure in order to provide a basic understanding to the reader. This summary is not an extensive overview of the disclosure and it does not identify key/critical components of the present invention or delineate the scope of the present invention. Its sole purpose is to present some concepts disclosed herein in a simplified form as a prelude to the more detailed description that is presented later.

According to embodiments of the present disclosure, the present disclosure provides a system and a method of testing a single device under test (DUT) through multiple cores in parallel, to solve or circumvent aforesaid problems and disadvantages in the related art.

An embodiment of the present disclosure is related to a system of testing a single device under test (DUT) through multiple cores in parallel, and the system includes a computer device and a plurality of test cores. The test cores are electrically connected to the computer device, and the computer device is configured to evenly allocate a test quantity of the DUT to the test cores, so as to control a period of testing the DUT through the test cores in parallel.

In one embodiment of the present disclosure, the computer device calculates a plurality of total capacitance values of a plurality of test nets of the DUT, and classifies and ranks the total capacitance values, so as to allocate the test nets to the test cores correspondingly, thereby equalizing the sum of the total capacitance values for the test cores each.

In one embodiment of the present disclosure, the computer device divides the test nets into a plurality of test nets to be allocated and at least one remaining test net, each of plural total capacitance values of the test nets to be allocated is greater than a predetermined capacitance value, and the computer device arranges the plural total capacitance values from large to small to sort the test nets to be allocated correspondingly as a plurality of sorted test nets, so as to allocate the sorted test nets to the test cores.

In one embodiment of the present disclosure, the plurality of test cores are first to Nth test cores, and the computer device allocates the sorted test nets to the first to the Nth test cores through a to-and-fro allocation, an odd-even allocation, or a random average allocation.

In one embodiment of the present disclosure, the total capacitance value of the at least one remaining test net is less than or equal to the predetermined capacitance value, and the computer device randomly selects one from the test cores to test the at least one remaining test net.

In one embodiment of the present disclosure, the computer device calculates an amount of each kind of test parameters of the DUT, so as to evenly allocate the amount of each kind of test parameters for the test cores each.

In one embodiment of the present disclosure, the each kind of test parameters are non-capacitive parameters.

In one embodiment of the present disclosure, the non-capacitive parameters are resistance values, inductance values, voltage values, power-on parameters, electrical parameters of pins of an integrated circuit, and voltage parameters of a clamping diode.

Another embodiment of the present disclosure is related to a method of testing a single DUT through multiple cores in parallel, and the method includes steps of: calculating a test quantity of the DUT; and evenly allocating the test quantity of the DUT to a plurality of test cores, so as to control a period of testing the DUT through the test cores in parallel.

In one embodiment of the present disclosure, the method further includes steps of: calculating a plurality of total capacitance values of a plurality of test nets of the DUT, and classifying and ranking the total capacitance values, so as to allocate the test nets to the test cores correspondingly, thereby equalizing the sum of the total capacitance values for the test cores each.

In one embodiment of the present disclosure, the method further includes steps of: dividing the test nets into a plurality of test nets to be allocated and at least one remaining test net, and each of plural total capacitance values of the test nets to be allocated being greater than a predetermined capacitance value; and arranging the plural total capacitance values from large to small to sort the test nets to be allocated correspondingly as a plurality of sorted test nets, so as to allocate the sorted test nets to the test cores.

In one embodiment of the present disclosure, the plurality of test cores are first to Nth test cores, and the method further includes steps of: allocating the sorted test nets to the first to the Nth test cores through a to-and-fro allocation, an odd-even allocation, or a random average allocation.

In one embodiment of the present disclosure, the total capacitance value of the at least one remaining test net is less than or equal to the predetermined capacitance value, and the method further includes steps of: randomly selecting one from the test cores to test the at least one remaining test net.

In one embodiment of the present disclosure, the method further includes steps of: calculating an amount of each kind of test parameters of the DUT, so as to evenly allocate the amount of each kind of test parameters for the test cores each.

In one embodiment of the present disclosure, the each kind of test parameters are non-capacitive parameters.

In one embodiment of the present disclosure, the non-capacitive parameters are resistance values, inductance values, voltage values, power-on parameters, electrical parameters of pins of an integrated circuit, and voltage parameters of a clamping diode.

In view of the above, according to the present disclosure, the system and method of testing the single DUT through multiple cores in parallel can save testing period of time, thereby shortening the production time of products and improving the efficiency of factory production lines.

Many of the attendant features will be more readily appreciated, as the same becomes better understood by reference to the following detailed description considered in connection with the accompanying drawings.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
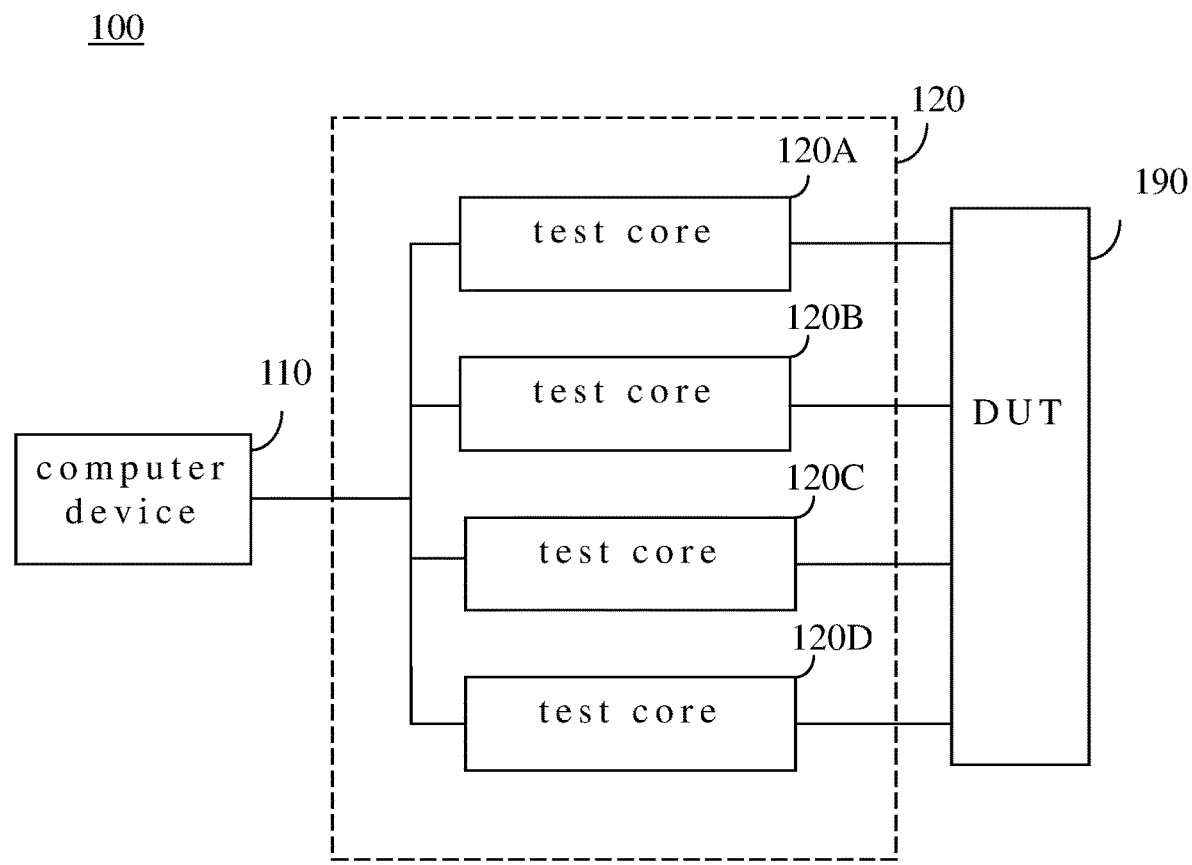
FIG. 1 is a block diagram of testing a single DUT through multiple cores in parallel according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

Referring to FIG. 1. In one aspect, the present disclosure is directed to a system 100 of testing the single device under test (DUT) 190 through multiple cores in parallel. This system may be easily integrated into the test equipment and may be applicable or readily adaptable to all technologies. The system 100 of testing the single DUT 190 through multiple cores in parallel can save testing period of time, thereby shortening the production time of products and improving the efficiency of factory production lines. Accordingly, the system 100 of testing the single DUT 190 through multiple cores in parallel has advantages. Herewith the system 100 of testing the single DUT 190 through multiple cores in parallel is described below with FIG. 1.

The subject disclosure provides the system 100 of testing the single DUT 190 through multiple cores in parallel in accordance with the subject technology. Various aspects of the present technology are described with reference to the drawings. In the following description, for purposes of explanation, numerous specific details are set forth in order to provide a thorough understanding of one or more aspects. It can be evident, however, that the present technology can be practiced without these specific details. In other instances, well-known structures and devices are shown in block diagram form in order to facilitate describing these aspects. The word "exemplary" is used herein to mean "serving as an example, instance, or illustration." Any embodiment described herein as "exemplary" is not necessarily to be construed as preferred or advantageous over other embodiments.

FIG. 1 is a block diagram of the system 100 of testing the single DUT 190 through multiple cores in parallel according to some embodiments of the present disclosure. As shown in FIG. 1, the system 100 includes a computer device 110 and a plurality of test cores 120A, 120B, 120C and 120D (e.g., automatic test core circuit devices). As used in the description herein and throughout the claims that follow, the terms "comprise or comprising", "include or including", "have or having", "contain or containing" and the like are to be understood to be open-ended, i.e., to mean including but not limited to.

In practice, the computer device 110 may be a computer host, a processor or a server. For an instance, the computer device 110 is the server, and the server can be remotely managed in a manner that provides accessibility, consistency, and efficiency. Remote management removes the need for input/output interfaces in the servers. An administrator can manage a large data centers containing numerous rack servers using a variety of remote management tools, such as simple terminal connections, remote desktop applications, and software tools used to configure, monitor, and troubleshoot server hardware and software.

For an instance, the computer device 110 is the computer host, in which the functions or operations of the present disclosure may be hardware, software, and/or firmware. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

For an instance, the computer device 110 is the processor, and the processor may be an integrated circuit chip with signal processing capabilities. In an implementation process, steps may be completed by a hardware integrated logic circuit or an instruction in the form of software in the processor. The above-described processor may be a general-purpose processor, including a Central Processing Unit (CPU), a net Processor (NP) and the like, and may also be a Digital Signal Processor (DSP), an Application Specific Integrated Circuit (ASIC), a Field-Programmable Gate Array (FPGA) or other programmable logic devices, discrete gates, transistor logic devices, and discrete hardware components, which can implement or execute various methods, steps and logic block diagrams disclosed in the embodiments of the present disclosure. The general-purpose processor may be a micro-processor, or the processor may be any conventional processor. Steps of the method disclosed with reference to one or more embodiments of the present disclosure may be directly executed and completed by a hardware decoding processor or by a combination of hardware and software modules in a decoding processor. The software modules may be located in a mature storage medium in the art, such as a random-access memory, a flash memory, a read-only memory, a programmable read-only memory or an electrically erasable programmable memory, a register, and the like. The storage medium is located in the memory, and the processor reads information in the memory and completes steps of the present disclosure in combination with the hardware of the processor.

In structure, the test cores 120A, 120B, 120C and 120D are electrically connected to the computer device 110. The test cores 120A, 120B, 120C and 120D can be disposed in the test machine 120. The test machine 120 can be equipped with a switch board (not shown). The switch board can switch electrical paths among the test cores 120A, 120B, 120C and 120D (e.g., automatic test core circuits). In the test machine 120, each test core can have an independent test capability. It should be noted that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. For example, the computer device 110 may be a built-in processor that is directly connected to the test cores 120A, 120B, 120C and 120D, or the printing device 133 may be an external computer host that is indirectly connected to the test cores 120A, 120B, 120C and 120D through the switch board.

For example, the DUT 190 may be an object (e.g., a printed circuit board) having active components and/or passive components, but the present disclosure is not limited thereto. In use, the computer device 110 is configured to evenly allocate a test quantity of the DUT 190 to the test cores 120A, 120B, 120C and 120D, so as to control a period of testing the DUT 190 through the test cores 120A, 120B, 120C and 120D in parallel. Compared with a machine having a single test core only, in the present disclosure the system 100 of testing the single DUT 190 through multiple cores in parallel can save testing period of time, thereby shortening the production time of products and improving the efficiency of factory production lines.

In practice, the DUT 190 has one or more test nets. Each test net can be a measurement point or a set of multiple associated measurement points, or a connection point or a set of multiple associated connection points. When the capacitor of the DUT 190 has a larger capacitance, its discharge speed is slower. In a control experiment, a single test core is used only, and the capacitors of the test net are discharged one by one through a resistor placed inside the test core, and thus the discharge time is longer. In order to speed up the discharge and measurement of large capacitors, in one embodiment of the present disclosure, the computer device 110 calculates a plurality of total capacitance values of a plurality of test nets of the DUT 190, and classifies and ranks the total capacitance values, so as to allocate the test nets to the test cores correspondingly, thereby equalizing the sum of the total capacitance values for the test cores 120A, 120B, 120C and 120D each. Accordingly, every respective allocation of the sum of the total capacitance values for each of the plurality of test cores 120A, 120B, 120C and 120D is approximately equal to each other. Compared with the control experiment using a single test core, the discharge time of the present disclosure can be greatly shortened.

It should be noted that although only four test cores 120A, 120B, 120C and 120D are shown in FIG. 1, the number of test cores of the present disclosure is not limited thereto. The plurality of test cores may be the first to Nth test cores, where N is a positive integer greater than 1. Compared with the control experiment using a single test core, the ideal discharge time of this embodiment can be shortened by about 1/N.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

In one embodiment of the present disclosure, the computer device 110 divides the test nets of the DUT 190 into a plurality of test nets to be allocated and at least one remaining test net, where each of plural total capacitance values of the test nets to be allocated is greater than a predetermined capacitance value (e.g., 100 uF). It should be noted that the predetermined capacitance value capacitance value can be flexibly adjusted by the system administrator or other personnel depending on the actual application. In practice, the total capacitance value of one or more large capacitors is greater than the predetermined capacitance value, and the discharge time is longer. If the plural total capacitance values of the test nets are not properly allocated to the test cores 120A, 120B, 120C and 120D, the test delays will occur. Therefore, the computer device 110 arranges the plural total capacitance values from large to small to sort the test nets to be allocated correspondingly as a plurality of sorted test nets, so as to allocate the sorted test nets to the test cores 120A, 120B, 120C and 120D.

In one embodiment of the present disclosure, the test cores 120A, 120B, 120C and 120D are first to Nth test cores, and the computer device 110 allocates the sorted test nets to the first to the Nth test cores through a to-and-fro allocation. For example, in FIG. 1, the test cores 120A, 120B, 120C and 120D may be a first test core 120A, a second test core 120B, a third test core 120C and a fourth test core 120D, and the computer device 110 allocate the sorted test nets from the first, second, third to the fourth test core 120A, 120B, 120C, 120D and then from the fourth, third, second to the first test core 120D, 120C, 120B, 120A repeatedly. In practice, the sorted test nets corresponding to the plural total capacitance values from large to small are allocated through the to-and-fro allocation, so that every respective allocation of the sum of the plural total capacitance values for each of the plurality of test cores 120A, 120B, 120C and 120D can be almost approximately equal to each other. Then, according to the test nets allocated by the computer device 110, the test cores 120A, 120B, 120C and 120D test the DUT 190 in parallel. In the experiment of capacitor discharge, it can save 70% of the test period of time. In addition to the aforementioned to-and-fro allocation, in anther embodiment, an odd-even allocation, random average allocation, or other allocation methods may also be used. Those skilled in the art should flexibly choose the allocation method according to the desired application. For example, in the odd-even allocation, the sorted test nets are allocated to the first and third test cores 120A and 120C and then allocated to the second and fourth test cores 120B and 120D repeatedly; alternatively, the sorted test nets are allocated to the second and fourth test cores 120B and 120D and then allocated to the first and third test cores 120A and 120C repeatedly. For example, in the random average allocation, the sorted test nets corresponding to the plural total capacitance values from large to small are allocated to the test cores through a random arrangement, such as form the second, third, first to fourth test cores 120B, 120C, 120D and 120A, repeatedly.

In one embodiment of the present disclosure, the total capacitance value of the at least one remaining test net of the DUT 190 is less than or equal to the predetermined capacitance value. In practice, the discharge time required by capacitors smaller than the predetermined capacitance value is too short, which accounts for a very small proportion of the overall test time. Therefore, the computer device 100 randomly selects one (e.g., the test core 120C) from the test cores 120A, 120B, 120C and 120D to test the at least one remaining test net. Alternatively, in another embodiment, there is no need to use a predetermined capacitance value to distinguish the test net to be allocated from the remaining test net. The computer device 110 directly adopts the above-mentioned repeatedly to-and-fro allocation, odd-even allocation, random average allocation or other allocation methods, and the all of the test nets of the DUT 190 are equally distributed to the test cores 120A, 120B, 120C and 120D, so that every respective allocation of the sum of the plural total capacitance values for each of the plurality of test cores 120A, 120B, 120C and 120D can be approximately equal to each other.

The test core 120A, the test core 120B, the test core 120C and the test core 120D as mentioned above, can be implemented as test cores of the same specification to increase the parallel test efficiency, or they can also be test cores of different specifications. One of ordinary skill in the art will appreciate that FIG. 1 is provided for illustrative purposes only to further explain applications of these databases and are not meant to limit the number of test cores and test functions in any manner. In one or more embodiments, multiple test cores can be combined into one combined test core, and the combined test core and the other test cores can perform the test in parallel, or the function of one test core is changed to another test core for execution. Those with ordinary skill in the art may design one or more these test cores depending on the desired application.

In practice, the manner of testing the single DUT 190 through multiple cores in parallel can be applied to a manufacturing defects analyzer (MDA). In the manufacturing defect analyzer, the discharge and measurement of large capacitors are accelerated based on multiple test cores. Similarly, the manner of testing the single DUT 190 through multiple cores in parallel can be applied to an in-circuit tester (ICT) or any test equipment.

In addition to the total capacitance values of each test net, in practice, the system 100 of testing the single DUT 190 through multiple cores in parallel can test each kind of test parameters (e.g., non-capacitive parameters) of the DUT 190. Since the non-capacitive parameters do not have obvious test lags, in one embodiment of the present disclosure, the computer device 110 calculates an amount of each kind of test parameters (e.g., non-capacitive parameters) of the DUT 190, so as to evenly allocate the amount of each kind of test parameters for the test cores 120A, 120B, 120C and 120D each. Accordingly, the number of tests for each of the plurality of test cores 120A, 120B, 120C and 120D is approximately equal to each other. Compared with the control experiment using a single test core, the test time of the present disclosure can be greatly shortened.

In one embodiment of the present disclosure, the non-capacitive parameters are resistance values, inductance values, voltage values, power-on parameters, electrical parameters of pins of an integrated circuit, and voltage parameters of a clamping diode. In practice, for example, the electrical parameters (e.g., voltage parameters) of the pins of the integrated circuit can be sensed by TestJet or other similar technologies to determine whether the pins are abnormal (e.g., an open circuit); the voltage parameters of the clamping diode can be determined by sending a small current from the input/output pin of the clamp diode and measure the voltage difference between the voltage source (Vcc) connected to the circuit and the input/output pin, so as to determine whether the source or the input/output pins are opened, or measure the voltage difference between the ground terminal and the input/output pins to determine whether the ground or input/output pins are opened. It should be noted that the above-mentioned measurement technology as to the voltage parameters of the clamp diode and the TestJet is well known in the art, and thus is not described in detail herein.

Figure 2:
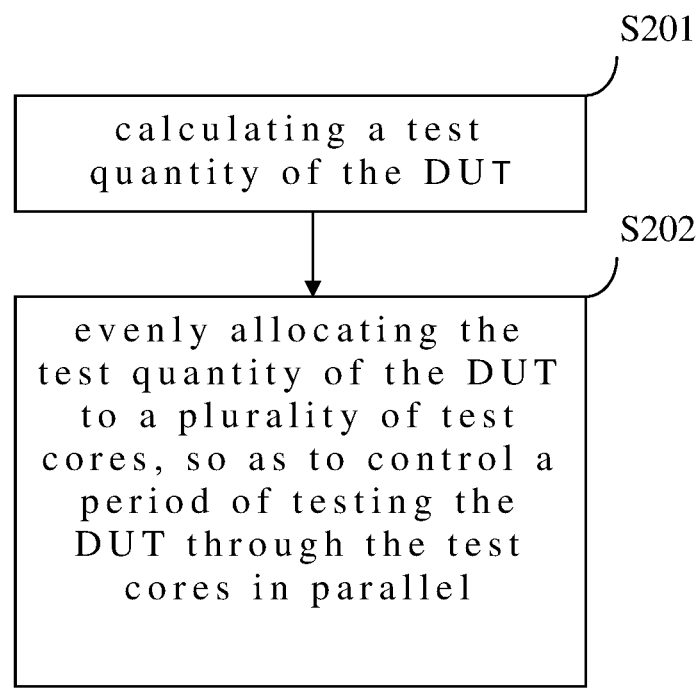
FIG. 2 is a flow chart of a method of testing the single DUT through multiple cores in parallel according to some embodiments of the present disclosure.

For a more complete understanding of a method performed by the system 100 of testing the single DUT 190 through multiple cores in parallel, referring FIGS. 1-2, FIG. 2 is a flow chart of the method 200 of testing the single DUT 190 through multiple cores in parallel according to an embodiment of the present disclosure. As shown in FIG. 2, the method 200 includes operations S201 and S202. However, as could be appreciated by persons having ordinary skill in the art, for the steps described in the present embodiment, the sequence in which these steps is performed, unless explicitly stated otherwise, can be altered depending on actual needs; in certain cases, all or some of these steps can be performed concurrently.

The method 200 of testing the single DUT 190 through multiple cores in parallel as described above can be implemented by a computer, such as the aforementioned computer device 110. The parts of the functions can be implemented as a computer program stored in a non-transitory computer readable medium, and the non-transitory computer readable medium to store a plurality of instructions for commanding a computer to execute the method 200 of testing the single DUT 190 through multiple cores in parallel.

For example, the method 200 of testing the single DUT 190 through multiple cores in parallel may take the form of a computer program product on a computer-readable storage medium having computer-readable instructions embodied in the medium. Any suitable storage medium may be used including non-volatile memory such as read only memory (ROM), programmable read only memory (PROM), erasable programmable read only memory (EPROM), and electrically erasable programmable read only memory (EEPROM) devices; volatile memory such as SRAM, DRAM, and DDR-RAM; optical storage devices such as CD-ROMs and DVD-ROMs; and magnetic storage devices such as hard disk drives and floppy disk drives.

In one embodiment of the present disclosure, in operation S201, a test quantity of the DUT 190 is calculated; in operation S202, the test quantity of the DUT 190 is evenly allocated to a plurality of test cores, so as to control a period of testing the DUT 190 through the test cores 120A, 120B, 120C and 120D in parallel. Therefore, compared with a machine having a single test core only, in the present disclosure the method 200 of testing the single DUT 190 through multiple cores in parallel can save testing period of time, thereby shortening the production time of products and improving the efficiency of factory production lines.

In one embodiment of the present disclosure, the method 200 further includes steps of: calculating a plurality of total capacitance values of a plurality of test nets of the DUT 190, and classifying and ranking the total capacitance values, so as to allocate the test nets to the test cores 120A, 120B, 120C and 120D correspondingly, thereby equalizing the sum of the total capacitance values for the test cores 120A, 120B, 120C and 120D each. Accordingly, every respective allocation of the sum of the total capacitance values for each of the plurality of test cores 120A, 120B, 120C and 120D is approximately equal to each other, so that the discharge time can be greatly shortened.

In one embodiment of the present disclosure, the method 200 further includes steps of: dividing the test nets into a plurality of test nets to be allocated and at least one remaining test net, and each of plural total capacitance values of the test nets to be allocated being greater than a predetermined capacitance value; and arranging the plural total capacitance values from large to small to sort the test nets to be allocated correspondingly as a plurality of sorted test nets, so as to allocate the sorted test nets to the test cores 120A, 120B, 120C and 120D.

In one embodiment of the present disclosure, the plurality of test cores 120A, 120B, 120C and 120D are first to Nth test cores, and in the method 200, the sorted test nets are allocated from the first to Nth test cores and then from the Nth to the first test cores repeatedly, where N is a positive integer (e.g., 4) greater than 1. In practice, the sorted test nets corresponding to the plural total capacitance values from large to small are allocated to the first to Nth test cores through the to-and-fro allocation, the odd-even allocation, the random average allocation, or the like, so that every respective allocation of the sum of the plural total capacitance values for each of the plurality of test cores 120A, 120B, 120C and 120D can be almost approximately equal to each other. Then, according to the test nets as allocated above, the test cores 120A, 120B, 120C and 120D test the DUT 190 in parallel. In the experiment of capacitor discharge, it can save 70% of the test period of time.

In one embodiment of the present disclosure, the total capacitance value of the at least one remaining test net is less than or equal to the predetermined capacitance value. In practice, the discharge time required by capacitors smaller than the predetermined capacitance value is too short, which accounts for a very small proportion of the overall test time. Therefore, the method 200 further includes steps of: randomly selecting one from the test cores 120A, 120B, 120C and 120D to test the at least one remaining test net.

In addition to the total capacitance values of each test net, in practice, the method 200 of testing the single DUT 190 through multiple cores in parallel can test each kind of test parameters (e.g., non-capacitive parameters) of the DUT 190. Since the non-capacitive parameters do not have obvious test lags, in one embodiment of the present disclosure, the method 200 further includes steps of: calculating an amount of each kind of test parameters (e.g., non-capacitive parameters) of the DUT 190, so as to evenly allocate the amount of each kind of test parameters for the test cores 120A, 120B, 120C and 120D each. Accordingly, the number of tests for each of the plurality of test cores 120A, 120B, 120C and 120D is approximately equal to each other.

In one embodiment of the present disclosure, the non-capacitive parameters are resistance values, inductance values, voltage values, power-on parameters, electrical parameters of pins of an integrated circuit, and voltage parameters of a clamping diode.

In view of the above, according to the present disclosure, the system 100 and the method 200 of testing the single DUT 190 through multiple cores in parallel can save testing period of time, thereby shortening the production time of products and improving the efficiency of factory production lines.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A system of testing a single device under test (DUT) through multiple cores in parallel, and the system comprising:
   a computer device; and
   a plurality of test cores electrically connected to the computer device, and the computer device configured to evenly allocate a test quantity of the DUT to the test cores, so as to control a period of testing the DUT through the test cores in parallel.

2. The system of claim 1, wherein the computer device calculates a plurality of total capacitance values of a plurality of test nets of the DUT, and classifies and ranks the total capacitance values, so as to allocate the test nets to the test cores correspondingly, thereby equalizing a sum of the total capacitance values for the test cores each.

3. The system of claim 2, wherein the computer device divides the test nets into a plurality of allocated test nets and at least one remaining test net, each of plural total capacitance values of the allocated test nets is greater than a predetermined capacitance value, and the computer device arranges the plural total capacitance values from large to small to sort the allocated test nets correspondingly as a plurality of sorted test nets, so as to allocate the sorted test nets to the test cores.

4. The system of claim 3, wherein the plurality of test cores are first to Nth test cores, and the computer device allocates the sorted test nets to the first to the Nth test cores through a to-and-fro allocation, an odd-even allocation, or a random average allocation.

5. The system of claim 3, wherein the total capacitance value of the at least one remaining test net is less than or equal to the predetermined capacitance value, and the computer device randomly selects one from the test cores to test the at least one remaining test net.

6. The system of claim 1, wherein the computer device calculates an amount of each kind of test parameters of the DUT, so as to evenly allocate the amount of each kind of test parameters for each of the test cores.

7. The system of claim 6, wherein the each kind of test parameters are non-capacitive parameters.

8. The system of claim 7, wherein the non-capacitive parameters are resistance values, inductance values, voltage values, power-on parameters, electrical parameters of pins of an integrated circuit, and voltage parameters of a clamping diode.

9. A method of testing a single DUT through multiple cores in parallel, and the method comprising steps of:
   calculating a test quantity of the DUT; and
   evenly allocating the test quantity of the DUT to a plurality of test cores, so as to control a period of testing the DUT through the test cores in parallel.

10. The method of claim 9, further comprising:
    calculating a plurality of total capacitance values of a plurality of test nets of the DUT, and classifying and ranking the total capacitance values, so as to allocate the test nets to the test cores correspondingly, thereby equalizing a sum of the total capacitance values for the test cores each.

11. The method of claim 10, further comprising:
    dividing the test nets into a plurality of allocated test nets and at least one remaining test net, and each of plural total capacitance values of the allocated test nets being greater than a predetermined capacitance value; and
    arranging the plural total capacitance values from large to small to sort the allocated test nets correspondingly as a plurality of sorted test nets, so as to allocate the sorted test nets to the test cores.

12. The method of claim 11, wherein the plurality of test cores are first to Nth test cores, and the method further comprises:

allocating the sorted test nets to the first to the Nth test cores through a to-and-fro allocation, an odd-even allocation, or a random average allocation.

13. The method of claim 11, wherein the total capacitance value of the at least one remaining test net is less than or equal to the predetermined capacitance value, and the method further comprises:

randomly selecting one from the test cores to test the at least one remaining test net.

14. The method of claim 9, further comprising:

calculating an amount of each kind of test parameters of the DUT, so as to evenly allocate the amount of each kind of test parameters for each of the test cores.

15. The method of claim 14, wherein the each kind of test parameters are non-capacitive parameters.

16. The method of claim 15, wherein the non-capacitive parameters are resistance values, inductance values, voltage values, power-on parameters, electrical parameters of pins of an integrated circuit, and voltage parameters of a clamping diode.

* * * * *